(12) United States Patent
Sun et al.

(10) Patent No.: US 12,474,635 B2
(45) Date of Patent: Nov. 18, 2025

(54) PHOTOMASK STRUCTURE

(71) Applicant: United Microelectronics Corp., Hsinchu (TW)

(72) Inventors: Chia-Chen Sun, Kaohsiung (TW); En-Chiuan Liou, Tainan (TW); Song-Yi Lin, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 549 days.

(21) Appl. No.: 17/965,730

(22) Filed: Oct. 13, 2022

(65) Prior Publication Data

US 2024/0085780 A1 Mar. 14, 2024

(30) Foreign Application Priority Data

Sep. 8, 2022 (CN) .......................... 202211097837.3

(51) Int. Cl.
*G03F 1/76* (2012.01)
*G03F 1/36* (2012.01)

(52) U.S. Cl.
CPC . *G03F 1/76* (2013.01); *G03F 1/36* (2013.01)

(58) Field of Classification Search
None
See application file for complete search history.

(56) References Cited

U.S. PATENT DOCUMENTS

| | | | |
|---|---|---|---|
| 7,856,606 B2 | 12/2010 | Eurlings et al. | |
| 2004/0037503 A1* | 2/2004 | Hastings | G02B 6/124 385/37 |
| 2005/0031976 A1* | 2/2005 | Kotani | G03F 1/36 430/30 |
| 2009/0202923 A1* | 8/2009 | Takeuchi | G03F 1/36 430/5 |
| 2016/0062231 A1* | 3/2016 | Cai | G03F 1/82 430/5 |
| 2022/0097399 A1* | 3/2022 | Yamada | G03G 15/55 |

FOREIGN PATENT DOCUMENTS

| | | | | |
|---|---|---|---|---|
| CN | 1267083 A | * | 9/2000 | ............... G03F 1/44 |
| CN | 114594655 A | * | 6/2022 | |
| EP | 1152286 A1 | * | 11/2001 | ............. G03B 21/62 |
| EP | 1152288 A1 | * | 11/2001 | ............... G03F 1/26 |
| KR | 2006113118 A | * | 11/2006 | ......... G02F 1/13306 |
| KR | 20070056583 A | * | 6/2007 | |
| WO | WO-9927420 A1 | * | 6/1999 | ............... G03F 1/36 |

* cited by examiner

*Primary Examiner* — Martin J Angebranndt
(74) *Attorney, Agent, or Firm* — JCIPRNET

(57) ABSTRACT

A photomask structure having a first region and a second region is provided. The layout pattern density of the first region is smaller than the layout pattern density of the second region. The photomask structure includes a first layout pattern, a second layout pattern, and first assist patterns. The first layout pattern is located in the first region and the second region. The second layout pattern is located in the second region. The second layout pattern is located on one side of the first layout pattern. The first assist patterns are located on the first sidewall of the first layout pattern and separated from each other. The first sidewall is adjacent to the second layout pattern. The first assist patterns are adjacent to a boundary between the first region and the second region. The lengths of two adjacent first assist patterns decrease in the direction away from the boundary.

18 Claims, 4 Drawing Sheets

PHOTOMASK STRUCTURE

CROSS-REFERENCE TO RELATED APPLICATION

This application claims the priority benefit of China application serial no. 202211097837.3, filed on Sep. 8, 2022. The entirety of the above-mentioned patent application is hereby incorporated by reference herein and made a part of this specification.

BACKGROUND

Technical Field

The invention relates to a photomask structure, and particularly relates to a photomask structure including assist patterns.

Description Of Related Art

In the semiconductor manufacturing process, the lithography technology plays an important role. However, the photoresist pattern formed by the lithography process often suffers from the necking problem near the boundary between the low pattern density region and the high pattern density region. Therefore, how to develop a photomask that can prevent the necking problem is the goal of continuous efforts.

SUMMARY

The invention provides a photomask structure, which can effectively prevent the necking problem of the photoresist pattern formed by the lithography process.

The invention provides a photomask structure, which has a first region and a second region. The layout pattern density of the first region is smaller than the layout pattern density of the second region. The photomask structure includes a first layout pattern, a second layout pattern, and first assist patterns. The first layout pattern is located in the first region and the second region. The second layout pattern is located in the second region. The second layout pattern is located on one side of the first layout pattern. The first assist patterns are located on the first sidewall of the first layout pattern and are separated from each other, and the first sidewall is adjacent to the second layout pattern. The first assist patterns are adjacent to a boundary between the first region and the second region. The lengths of two adjacent first assist patterns decrease in the direction away from the boundary.

According to an embodiment of the invention, in the photomask structure, one end of the first layout pattern may exceed one end of the second layout pattern and may exceed the boundary.

According to an embodiment of the invention, in the photomask structure, the extension direction of the first assist pattern may be perpendicular to the extension direction of the first layout pattern.

According to an embodiment of the invention, in the photomask structure, the first assist patterns may be located in the second region.

According to an embodiment of the invention, in the photomask structure, the first assist patterns may be further located in the first region.

According to an embodiment of the invention, in the photomask structure, lengths of another two adjacent first assist patterns may be the same.

According to an embodiment of the invention, in the photomask structure, the length of the first assist pattern closest to the boundary may be the greatest length of the lengths of the first assist patterns.

According to an embodiment of the invention, in the photomask structure, the spacings of the first assist patterns may be the same.

According to an embodiment of the invention, in the photomask structure, the spacings of the first assist patterns may be greater than or equal to the minimum spacing specified by the design rule.

According to an embodiment of the invention, in the photomask structure, the spacing between the first assist pattern and the second layout pattern may be greater than or equal to the minimum spacing specified by the design rule.

According to an embodiment of the invention, the photomask structure may further includes a third layout pattern and second assist patterns. The third layout pattern is located in the second region. The third layout pattern is located on another side of the first layout pattern. The second assist patterns are located on the second sidewall of the first layout pattern and are separated from each other, and the second sidewall may be adjacent to the third layout pattern. The second assist patterns may be adjacent to the boundary. The lengths of two adjacent second assist patterns may decrease in the direction away from the boundary.

According to an embodiment of the invention, in the photomask structure, one end of the first layout pattern may exceed one end of the third layout pattern.

According to an embodiment of the invention, in the photomask structure, the extension direction of the second assist pattern may be perpendicular to an extension direction of the first layout pattern.

According to an embodiment of the invention, in the photomask structure, the second assist patterns may be located in the second region.

According to an embodiment of the invention, in the photomask structure, the second assist patterns may be further located in the first region.

According to an embodiment of the invention, in the photomask structure, the lengths of another two adjacent second assist patterns may be the same.

According to an embodiment of the invention, in the photomask structure, the length of the second assist pattern closest to the boundary may be the greatest length of the lengths of the second assist patterns.

According to an embodiment of the invention, in the photomask structure, the spacings of the second assist patterns may be the same.

According to an embodiment of the invention, in the photomask structure, the spacings of the second assist patterns may be greater than or equal to the minimum spacing specified by the design rule.

According to an embodiment of the invention, in the photomask structure, the spacing between the second assist pattern and the third layout pattern may be greater than or equal to the minimum spacing specified by the design rule.

Based on the above description, the photomask structure according to the invention includes the first layout pattern, the second layout pattern, and the first assist patterns. The first layout pattern is located in the first region and the second region, and the second layout pattern is located in the second region. The first assist patterns are located on the first sidewall of the first layout pattern and are separated from each other, and the first sidewall is adjacent to the second layout pattern. The first assist patterns are adjacent to the boundary between the first region (e.g., low pattern density region) and the second region (e.g., high pattern density region), and the lengths of two adjacent first assist patterns decrease in the direction away from the boundary. Therefore, when the lithography process is performed by using the above photomask structure, the pattern fidelity of the lithography process can be improved. In this way, when the lithography process is performed by using the above photomask structure, the necking problem of the photoresist pattern formed by the lithography process and corresponding to the first layout pattern can be effectively prevented from occurring at vicinity of the position corresponding to the boundary, and the process window of the semiconductor process can be improved.

In order to make the aforementioned and other objects, features and advantages of the invention comprehensible, several exemplary embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The embodiments are described in detail below with reference to the accompanying drawings, but the embodiments are not intended to limit the scope of the invention. For the sake of easy understanding, the same components in the following description will be denoted by the same reference symbols. In addition, the drawings are for illustrative purposes only and are not drawn to the original dimensions. In fact, the dimensions of the various features may be arbitrarily increased or reduced for clarity of discussion.

Figure 1:
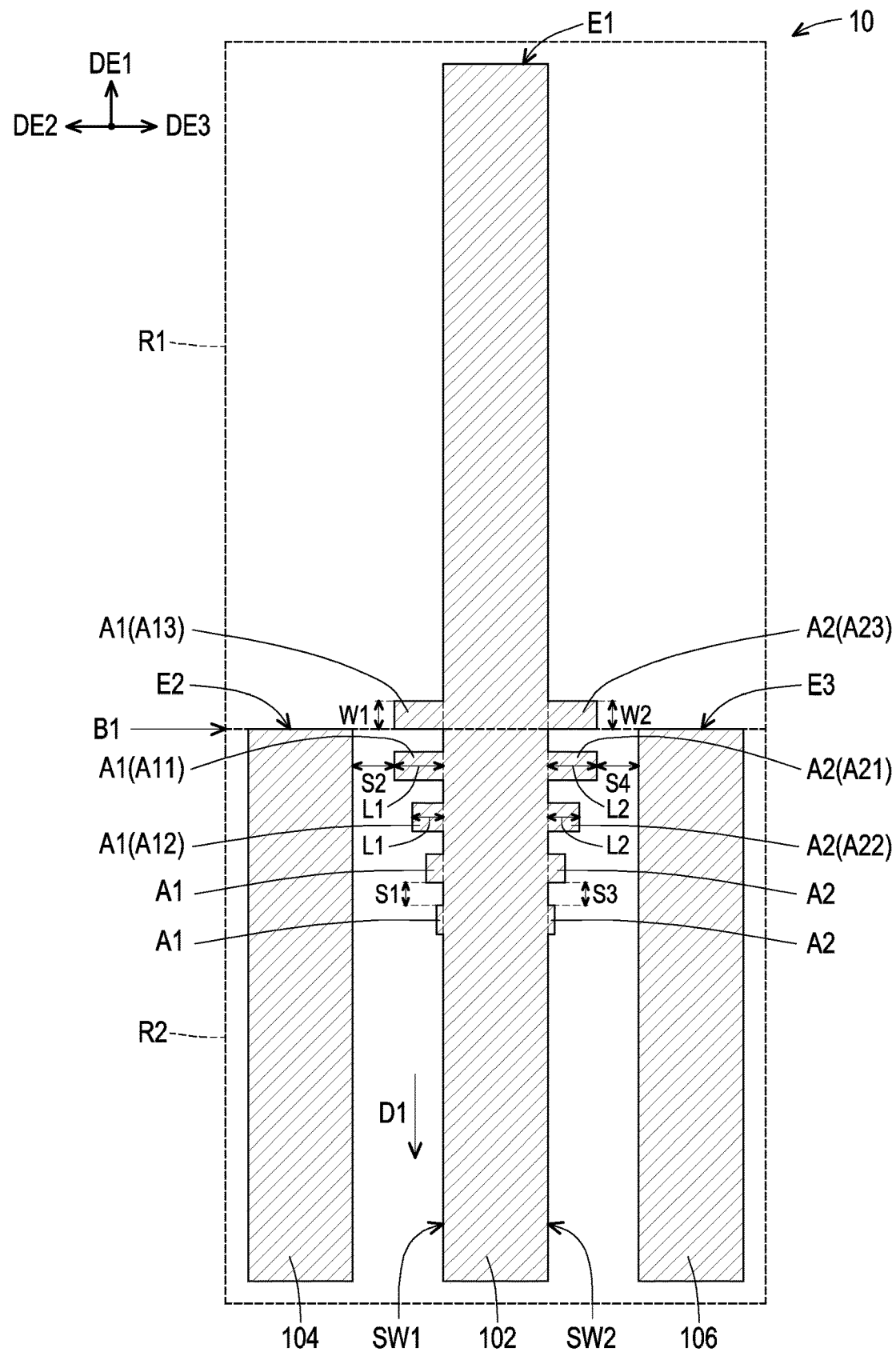
FIG. 1 is a schematic top view illustrating a photomask structure according to some embodiments of the invention.

FIG. 1 is a schematic top view illustrating a photomask structure according to some embodiments of the invention.

Referring to FIG. 1, a photomask structure 10 has a first region R1 and a second region R2. The first region R1 and the second region R2 have a boundary B1. The layout pattern density of the first region R1 is smaller than the layout pattern density of the second region R2. That is, the number of layout patterns per unit area of the first region R1 is smaller than the number of layout patterns per unit area of the second region R2. In some embodiments, the first region R1 may be a low pattern density region, and the second region R2 may be a high pattern density region. In the present embodiment, the first region R1 may be an isolated region, and the second region R2 may be a dense region.

The photomask structure 10 includes a layout pattern 102, a layout pattern 104, and assist patterns A1. In some embodiments, the photomask structure 10 may be a binary mask or a phase shift mask (PSM), but the invention is not limited thereto.

The layout pattern 102 is located in the first region R1 and the second region R2. The layout pattern 102 may be the main pattern on the photomask structure 10. In addition, the shape of the layout pattern 102 may be determined according to the product design and is not limited to the shape in FIG. 1.

The layout pattern 104 is located in the second region R2. The layout pattern 104 is located on one side of the layout pattern 102. The layout pattern 104 may be the main pattern on the photomask structure 10. In some embodiments, one end E1 of the layout pattern 102 may exceed one end E2 of the layout pattern 104 and may exceed the boundary B1. In addition, the shape of the layout pattern 104 may be determined according to the product design and is not limited to the shape in FIG. 1.

The assist patterns A1 are located on the sidewall SW1 of the layout pattern 102 and are separated from each other, and the sidewall SW1 is adjacent to the layout pattern 104. The assist pattern A1 can be used to improve the pattern fidelity of the lithography process. In some embodiments, the extension direction DE2 of the assist pattern A1 may be perpendicular to the extension direction DE1 of the layout pattern 102. In some embodiments, the layout pattern 102 and the assist patterns A1 may be integrally formed.

The assist patterns A1 are adjacent to the boundary B1 between the first region R1 and the second region R2. In some embodiments, the assist patterns A1 may be located in the second region R2. In some embodiments, the assist patterns A1 may be further located in the first region R1.

The lengths L1 of two adjacent assist patterns A1 decrease in the direction D1 away from the boundary B1. In some embodiments, the lengths L1 of two adjacent assist patterns A1 in the second region R2 decrease in the direction D1 away from the boundary B1. For example, the lengths L1 of the adjacent assist pattern A11 and assist pattern A12 in the second region R2 decrease in the direction D1 away from the boundary B1. That is, the length L1 of the assist pattern A11 is greater than the length L1 of the assist pattern A12. In some embodiments, the lengths L1 of another two adjacent assist patterns A1 may be the same. For example, the lengths L1 of the adjacent assist pattern A11 and assist pattern A13 may be the same. In some embodiments, the length L1 of the assist pattern A1 (e.g., assist pattern A13) closest to the boundary B1 may be the greatest length of the lengths L1 of the assist patterns A1.

In the present embodiment, the widths W1 of the assist patterns A1 may be the same, but the invention is not limited thereto. In other embodiments, the widths W1 of the assist patterns A1 may be different.

In the present embodiment, the spacings S1 of the assist patterns A1 may be the same, but the invention is not limited thereto. In other embodiments, the spacings S1 of the assist patterns A1 may be different. In some embodiments, the spacings S1 of the assist patterns A1 may be greater than or equal to the minimum spacing specified by the design rule. In some embodiments, the spacing S2 between the assist pattern A1 and the layout pattern 104 may be greater than or equal to the minimum spacing specified by the design rule.

In some embodiments, the photomask structure 10 may further include a layout pattern 106 and assist patterns A2. The layout pattern 106 is located in the second region R2. The layout pattern 106 is located on another side of the layout pattern 102. The layout pattern 106 may be the main pattern on the photomask structure 10. In some embodiments, one end E1 of the layout pattern 102 may exceed one end E3 of the layout pattern 106. In addition, the shape of the layout pattern 106 may be determined according to the product design and is not limited to the shape in FIG. 1.

The assist patterns A2 are located on the sidewall SW2 of the layout pattern 102 and are separated from each other, and the sidewall SW2 may be adjacent to the layout pattern 106. The assist pattern A2 can be used to improve the pattern fidelity of the lithography process. In some embodiments, the extension direction DE3 of the assist pattern A2 may be perpendicular to the extension direction DE1 of the layout pattern 102. In some embodiments, the layout pattern 102 and the assist patterns A2 may be integrally formed.

The assist patterns A2 may be adjacent to the boundary B1. In some embodiments, the assist patterns A2 may be located in the second region R2. In some embodiments, the assist patterns A2 may be further located in the first region R1.

The lengths L2 of two adjacent assist patterns A2 may decrease in the direction D1 away from the boundary B1. In some embodiments, the lengths L2 of two adjacent assist patterns A2 in the second region R2 may decrease in the direction D1 away from the boundary B1. For example, the lengths L2 of the adjacent assist pattern A21 and assist pattern A22 in the second region R2 may decrease in the direction D1 away from the boundary B1. That is, the length L2 of the assist pattern A21 may be greater than the length L2 of the assist pattern A22. In some embodiments, the lengths L2 of another two adjacent assist patterns A2 may be the same. For example, the lengths L2 of the adjacent assist pattern A21 and assist pattern A23 may be the same. In some embodiments, the length L2 of the assist pattern A2 (e.g., assist pattern A23) closest to the boundary B1 may be the greatest length of the lengths L2 of the assist patterns A2.

In the present embodiment, the widths W2 of the assist patterns A2 may be the same, but the invention is not limited thereto. In other embodiments, the widths W2 of the assist patterns A2 may be different.

In the present embodiment, the spacings S3 of the assist patterns A2 may be the same, but the invention is not limited thereto. In other embodiments, the spacings S3 of the assist patterns A2 may be different. In some embodiments, the spacings S3 of the assist patterns A2 may be greater than or equal to the minimum spacing specified by the design rule. In some embodiments, the spacing S4 between the assist pattern A2 and the layout pattern 106 may be greater than or equal to the minimum spacing specified by the design rule.

In some embodiments, when the photomask structure 10 is a binary mask, the layout pattern 102, the layout pattern 104, the layout pattern 106, the assist patterns A1, and the assist patterns A2 may be opaque patterns on the binary mask. In other embodiments, when the photomask structure 10 is a binary mask, the layout pattern 102, the layout pattern 104, the layout pattern 106, the assist patterns A1, and the assist patterns A2 may be light-transmitting patterns on the binary mask. In other embodiments, when the photomask structure 10 is a phase shift mask, the layout pattern 102, the layout pattern 104, the layout pattern 106, the assist patterns A1, and the assist patterns A2 may be phase shift patterns on the phase shift mask. In other embodiments, when the photomask structure 10 is a phase shift mask, the layout pattern 102, the layout pattern 104, the layout pattern 106, the assist patterns A1, and the assist patterns A2 may be light-transmitting patterns on the phase shift mask.

Based on the above embodiments, the photomask structure 10 includes the layout pattern 102, the layout pattern 104, and the assist patterns A1. The layout pattern 102 is located in the first region R1 and the second region R2, and the layout pattern 104 is located in the second region R2. The assist patterns A1 are located on the sidewall SW1 of the layout pattern 102 and are separated from each other, and the sidewall SW1 is adjacent to the layout pattern 104. The assist patterns A1 are adjacent to the boundary B1 between the first region R1 (e.g., low pattern density region) and the second region R2 (e.g., high pattern density region), and the lengths L1 of two adjacent assist patterns A1 decrease in the direction (e.g., direction D1) away from the boundary B1. Therefore, when the lithography process is performed by using the photomask structure 10, the pattern fidelity of the lithography process can be improved. In this way, when the lithography process is performed by using the photomask structure 10, the necking problem of the photoresist pattern formed by the lithography process and corresponding to the layout pattern 102 can be effectively prevented from occurring at vicinity of the position corresponding to the boundary B1, and the process window of the semiconductor process can be improved.

In some embodiments, the photomask structure 10 may further include the layout pattern 106 and the assist patterns A2. The layout pattern 106 is located in the second region R2. The assist patterns A2 are located on the sidewall SW2 of the layout pattern 102 and are separated from each other, and the sidewall SW2 may be adjacent to the layout pattern 106. The assist patterns A2 may be adjacent to the boundary B1 between the first region R1 (e.g., low pattern density region) and the second region R2 (e.g., high pattern density region), and the lengths L2 of two adjacent assist patterns A2 may decrease in the direction (e.g., direction D1) away from the boundary B1. Therefore, when the lithography process is performed by using the photomask structure 10, the pattern fidelity of the lithography process can be further improved. In this way, when the lithography process is performed by using the photomask structure 10, the necking problem of the photoresist pattern formed by the lithography process and corresponding to the layout pattern 102 can be further prevented from occurring at vicinity of the position corresponding to the boundary B1, and the process window of the semiconductor process can be improved.

Figure 2:
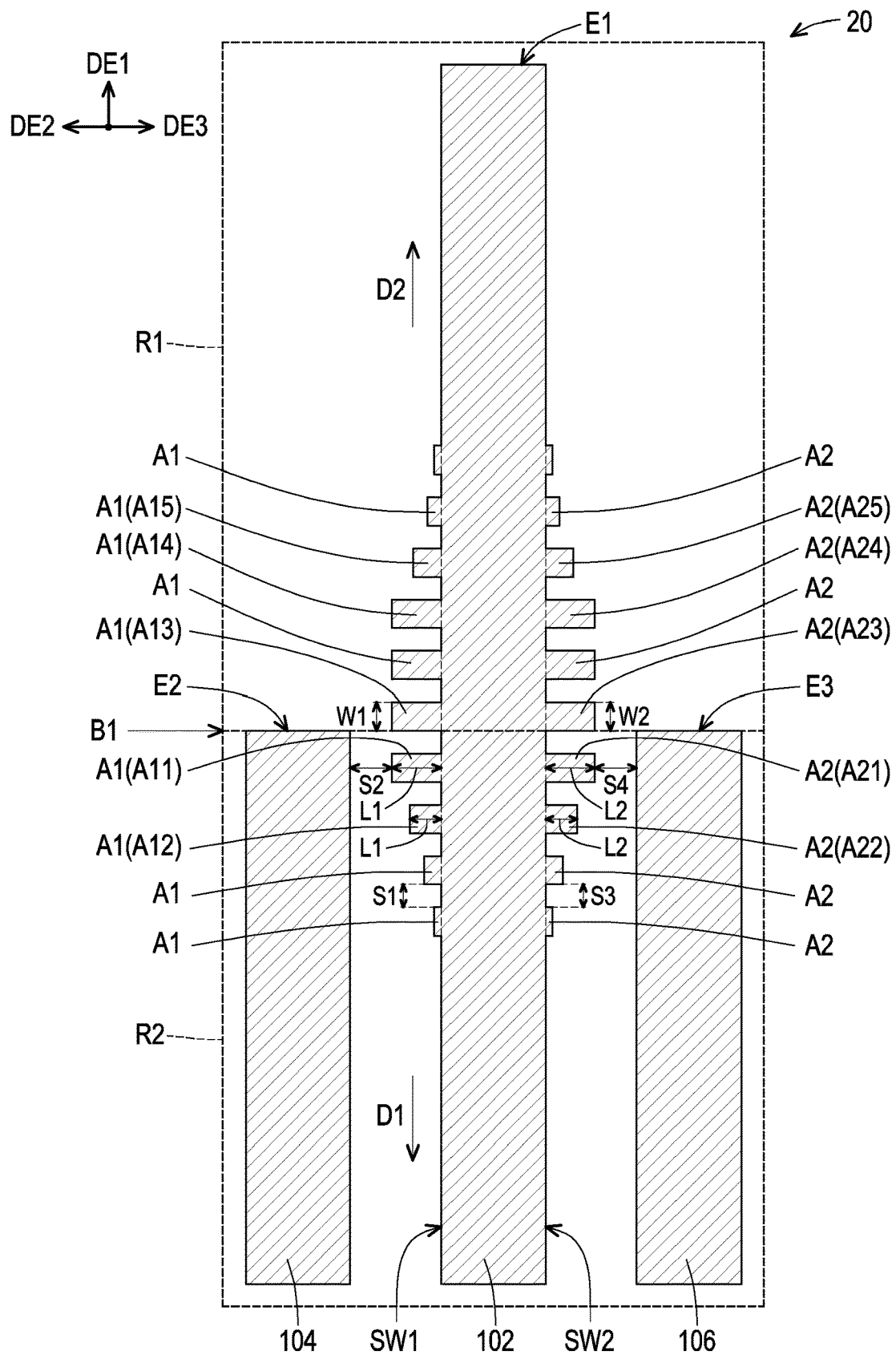
FIG. 2 is a schematic top view illustrating a photomask structure according to other embodiments of the invention.

FIG. 2 is a schematic top view illustrating a photomask structure according to other embodiments of the invention.

Referring to FIG. 1 and FIG. 2, the difference between the photomask structure 20 of FIG. 2 and the photomask structure 10 of FIG. 1 is as follows. In the photomask structure 20 of FIG. 2, the lengths L1 of two adjacent assist patterns A1 in the second region R2 decrease in the direction D1 away from the boundary B1, and the lengths L1 of two adjacent assist patterns A1 in the first region R1 decrease in the direction D2 away from the boundary B1. For example, the lengths L1 of the adjacent assist pattern A11 and assist pattern A12 in the second region R2 decrease in the direction D1 away from the boundary B1, and the lengths L1 of the adjacent assist pattern A14 and assist pattern A15 in the first region R1 decrease in the direction D2 away from the boundary B1. That is, the length L1 of the assist pattern A11 is greater than the length L1 of the assist pattern A12, and the length L1 of the assist pattern A14 is greater than the length L1 of the assist pattern A15.

In addition, in the photomask structure 20 of FIG. 2, the lengths L2 of two adjacent assist patterns A2 in the second region R2 may decrease in the direction D1 away from the boundary B1, and the lengths L2 of two adjacent assist patterns A2 in the first region R1 may decrease in the direction D2 away from the boundary B1. For example, the lengths L2 of the adjacent assist pattern A21 and assist pattern A22 in the second region R2 may decrease in the direction D1 away from the boundary B1, and the lengths L2 of the adjacent assist pattern A24 and assist pattern A25 in the first region R1 may decrease in the direction D2 away from the boundary B1. That is, the length L2 of the assist pattern A21 may be greater than the length L2 of the assist pattern A22, and the length L2 of the assist pattern A24 may be greater than the length L2 of the assist pattern A25.

Furthermore, in the photomask structure 10 of FIG. 1 and the photomask structure 20 of FIG. 2, the same or similar components are denoted by the same reference symbols, and the description thereof is omitted.

Based on the above embodiments, the photomask structure 20 includes the layout pattern 102, the layout pattern 104, and the assist patterns A1. The layout pattern 102 is located in the first region R1 and the second region R2, and the layout pattern 104 is located in the second region R2. The assist patterns A1 are located on the sidewall SW1 of the layout pattern 102 and are separated from each other, and the sidewall SW1 is adjacent to the layout pattern 104. The assist patterns A1 are adjacent to the boundary B1 between the first region R1 (e.g., low pattern density region) and the second region R2 (e.g., high pattern density region), and the lengths L1 of two adjacent assist patterns A1 decrease in the direction (e.g., direction D1 or direction D2) away from the boundary B1. Therefore, when the lithography process is performed by using the photomask structure 20, the pattern fidelity of the lithography process can be improved. In this way, when the lithography process is performed by using the photomask structure 20, the necking problem of the photoresist pattern formed by the lithography process and corresponding to the layout pattern 102 can be effectively prevented from occurring at vicinity of the position corresponding to the boundary B1, and the process window of the semiconductor process can be improved.

In some embodiments, the photomask structure 20 may further include the layout pattern 106 and the assist patterns A2. The layout pattern 106 is located in the second region R2. The assist patterns A2 are located on the sidewall SW2 of the layout pattern 102 and are separated from each other, and the sidewall SW2 may be adjacent to the layout pattern 106. The assist patterns A2 may be adjacent to the boundary B1 between the first region R1 (e.g., low pattern density region) and the second region R2 (e.g., high pattern density region), and the lengths L2 of two adjacent assist patterns A2 may decrease in the direction (e.g., direction D1 or direction D2) away from the boundary B1. Therefore, when the lithography process is performed by using the photomask structure 20, the pattern fidelity of the lithography process can be further improved. In this way, when the lithography process is performed by using the photomask structure 20, the necking problem of the photoresist pattern formed by the lithography process and corresponding to the layout pattern 102 can be further prevented from occurring at vicinity of the position corresponding to the boundary B1, and the process window of the semiconductor process can be improved.

Figure 3:
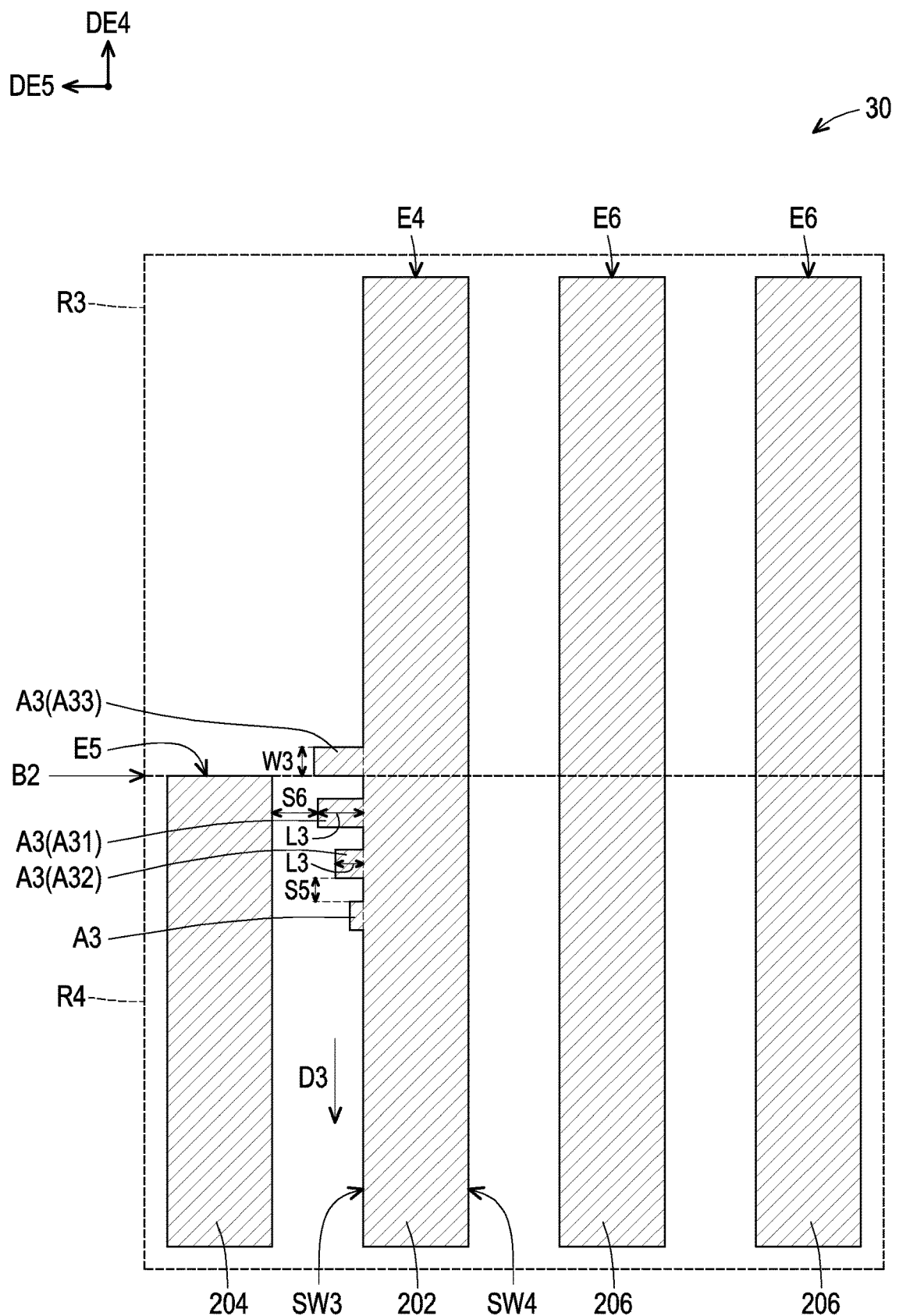
FIG. 3 is a schematic top view illustrating a photomask structure according to other embodiments of the invention.

FIG. 3 is a schematic top view illustrating a photomask structure according to other embodiments of the invention.

Referring to FIG. 3, a photomask structure 30 has a first region R3 and a second region R4. The first region R3 and the second region R4 have a boundary B2. The layout pattern density of the first region R3 is smaller than the layout pattern density of the second region R4. That is, the number of layout patterns per unit area of the first region R3 is smaller than the number of layout patterns per unit area of the second region R4. In some embodiments, the first region R3 may be a low pattern density region, and the second region R4 may be a high pattern density region. In the present embodiment, the first region R3 may be a semi-dense region, and the second region R4 may be a dense region.

The photomask structure 30 includes a layout pattern 202, a layout pattern 204, and assist patterns A3. In some embodiments, the photomask structure 30 may be a binary mask or a phase shift mask, but the invention is not limited thereto.

The layout pattern 202 is located in the first region R3 and the second region R4. The layout pattern 202 may be the main pattern on the photomask structure 30. In addition, the shape of the layout pattern 202 may be determined according to the product design and is not limited to the shape in FIG. 3.

The layout pattern 204 is located in the second region R4. The layout pattern 204 is located on one side of the layout pattern 202. The layout pattern 204 may be the main pattern on the photomask structure 30. In some embodiments, one end E4 of the layout pattern 202 may exceed one end E5 of the layout pattern 204 and may exceed the boundary B2. In addition, the shape of the layout pattern 204 may be determined according to the product design and is not limited to the shape in FIG. 3.

The assist patterns A3 are located on the sidewall SW3 of the layout pattern 202 and are separated from each other, and the sidewall SW3 is adjacent to the layout pattern 204. The assist pattern A3 can be used to improve the pattern fidelity of the lithography process. In some embodiments, the extension direction DE5 of the assist pattern A3 may be perpendicular to the extension direction DE4 of the layout pattern 202. In some embodiments, the layout pattern 202 and the assist patterns A3 may be integrally formed.

The assist patterns A3 are adjacent to the boundary B2 between the first region R3 and the second region R4. In some embodiments, the assist patterns A3 may be located in the second region R4. In some embodiments, the assist patterns A3 may be further located in the first region R3.

The lengths L3 of two adjacent assist patterns A3 decrease in the direction D3 away from the boundary B2. In some embodiments, the lengths L3 of two adjacent assist patterns A3 in the second region R4 decrease in the direction D3 away from the boundary B2. For example, the lengths L3 of the adjacent assist pattern A31 and assist pattern A32 in the second region R4 decrease in the direction D3 away from the boundary B2. That is, the length L3 of the assist pattern A31 is greater than the length L3 of the assist pattern A32. In some embodiments, the length L3 of the assist pattern A3 (e.g., assist pattern A33) closest to the boundary B2 may be the greatest length of the lengths L3 of the assist patterns A3. In the present embodiment, the lengths L3 of the assist patterns A3 are all different, but the invention is not limited thereto. In other embodiments, the assist patterns A3 may include two assist patterns A3 having the same length and adjacent to each other.

In the present embodiment, the widths W3 of the assist patterns A3 may be the same, but the invention is not limited thereto. In other embodiments, the widths W3 of the assist patterns A3 may be different.

In the present embodiment, the spacings S5 of the assist patterns A3 may be the same, but the invention is not limited thereto. In other embodiments, the spacings S5 of the assist patterns A3 may be different. In some embodiments, the spacings S5 of the assist patterns A3 may be greater than or equal to the minimum spacing specified by the design rule. In some embodiments, the spacing S6 between the assist pattern A3 and the layout pattern 204 may be greater than or equal to the minimum spacing specified by the design rule.

In the present embodiment, the photomask structure 30 may further include at least one layout pattern 206. In the present embodiment, the number of the layout patterns 206 is, for example, multiple, but the invention is not limited thereto. As long as the number of the layout patterns 206 is at least one, it falls within the scope of the invention. In other embodiments, photomask structure 30 may not include the layout pattern 206. The layout pattern 206 may be the main pattern on the photomask structure 30. In some embodiments, one end E4 of the layout pattern 202 may be flush with one end E6 of the layout pattern 206. In addition, the shape of the layout pattern 206 may be determined according to the product design and is not limited to the shape in FIG. 3.

In some embodiments, when the photomask structure 30 is a binary mask, the layout pattern 202, the layout pattern 204, the layout pattern 206, and the assist patterns A3 may be opaque patterns on the binary mask. In other embodiments, when the photomask structure 30 is a binary mask, the layout pattern 202, the layout pattern 204, the layout pattern 206, and the assist patterns A3 may be light-transmitting patterns on the binary mask. In other embodiments, when the photomask structure 30 is a phase shift mask, the layout pattern 202, the layout pattern 204, the layout pattern 206, and the assist patterns A3 may be phase shift patterns on the phase shift mask. In other embodiments, when the photomask structure 30 is a phase shift mask, the layout pattern 202, the layout pattern 204, the layout pattern 206, and the assist patterns A3 may be light-transmitting patterns on the phase shift mask.

Based on the above embodiments, the photomask structure 30 includes the layout pattern 202, the layout pattern 204, and the assist patterns A3. The layout pattern 202 is located in the first region R3 and the second region R4, and the layout pattern 204 is located in the second region R4. The assist patterns A3 are located on the sidewall SW3 of the layout pattern 202 and are separated from each other, and the sidewall SW3 is adjacent to the layout pattern 204. The assist patterns A3 are adjacent to the boundary B2 between the first region R3 (e.g., low pattern density region) and the second region R4 (e.g., high pattern density region), and the lengths L3 of two adjacent assist patterns A3 decrease in the direction (e.g., direction D3) away from the boundary B2. Therefore, when the lithography process is performed by using the photomask structure 30, the pattern fidelity of the lithography process can be improved. In this way, when the lithography process is performed by using the photomask structure 30, the necking problem of the photoresist pattern formed by the lithography process and corresponding to the layout pattern 202 can be effectively prevented from occurring at vicinity of the position corresponding to the boundary B2, and the process window of the semiconductor process can be improved.

Figure 4:
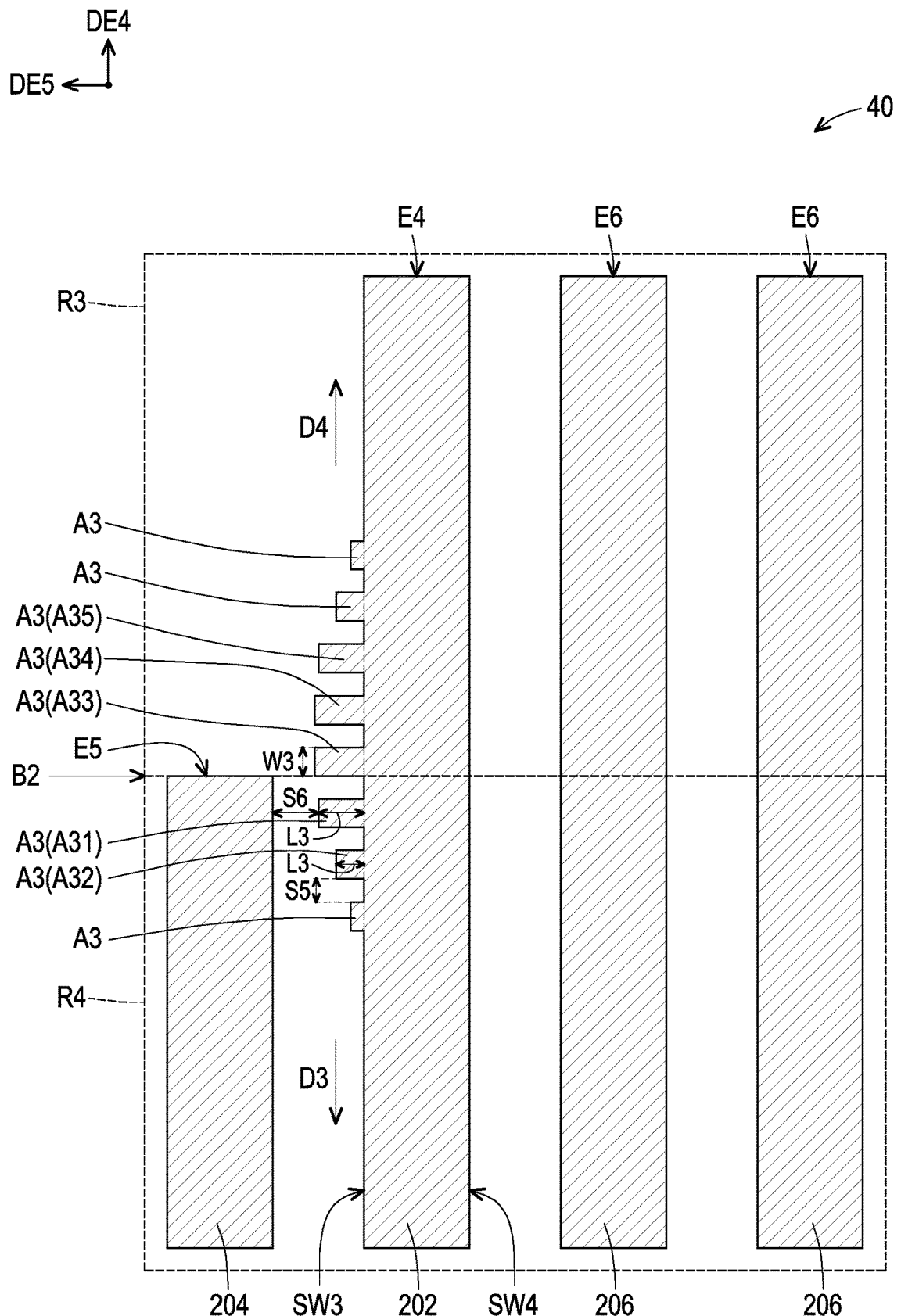
FIG. 4 is a schematic top view illustrating a photomask structure according to other embodiments of the invention.

FIG. 4 is a schematic top view illustrating a photomask structure according to other embodiments of the invention.

Referring to FIG. 3 and FIG. 4, the difference between the photomask structure 40 of FIG. 4 and the photomask structure 30 of FIG. 3 is as follows. In the photomask structure 40 of FIG. 4, the lengths L3 of two adjacent assist patterns A3 in the second region R4 decrease in the direction D3 away from the boundary B2, and the lengths L3 of two adjacent assist patterns A3 in the first region R3 decrease in the direction D4 away from the boundary B2. For example, the lengths L3 of the adjacent assist pattern A31 and assist pattern A32 in the second region R4 decrease in the direction D3 away from the boundary B2, and the lengths L3 of the adjacent assist pattern A34 and assist pattern A35 in the first region R3 decrease in the direction D4 away from the boundary B2. That is, the length L3 of the assist pattern A31 is greater than the length L3 of the assist pattern A32, and the length L3 of the assist pattern A34 is greater than the length L3 of the assist pattern A35. In some embodiments, the lengths L3 of another two adjacent assist patterns A3 may be the same. For example, the lengths L3 of the adjacent assist pattern A33 and assist pattern A34 may be the same.

Furthermore, in the photomask structure 30 of FIG. 3 and the photomask structure 40 of FIG. 4, the same or similar components are denoted by the same reference symbols, and the description thereof is omitted.

Based on the above embodiments, the photomask structure 40 includes the layout pattern 202, the layout pattern 204, and the assist patterns A3. The layout pattern 202 is located in the first region R3 and the second region R4, and the layout pattern 204 is located in the second region R4. The assist patterns A3 are located on the sidewall SW3 of the layout pattern 202 and are separated from each other, and the sidewall SW3 is adjacent to the layout pattern 204. The assist patterns A3 are adjacent to the boundary B2 between the first region R3 (e.g., low pattern density region) and the second region R4 (e.g., high pattern density region), and the lengths L3 of two adjacent assist patterns A3 decrease in the direction (e.g., direction D3 or direction D4) away from the boundary B2. Therefore, when the lithography process is performed by using the photomask structure 40, the pattern fidelity of the lithography process can be improved. In this way, when the lithography process is performed by using the photomask structure 40, the necking problem of the photoresist pattern formed by the lithography process and corresponding to the layout pattern 202 can be effectively prevented from occurring at vicinity of the position corresponding to the boundary B2, and the process window of the semiconductor process can be improved.

In summary, in the photomask structure of the aforementioned embodiments, the first layout pattern is located in the first region and the second region, and the second layout pattern is located in the second region. The assist patterns are located on the sidewall of the first layout pattern and are separated from each other, and the sidewall is adjacent to the second layout pattern. The assist patterns are adjacent to the boundary between the first region (e.g., low pattern density region) and the second region (e.g., high pattern density region), and the lengths of two adjacent assist patterns decrease in the direction away from the boundary. Therefore, when the lithography process is performed by using the aforementioned photomask structure, the pattern fidelity of the lithography process can be improved. In this way, the necking problem of the photoresist pattern formed by the lithography process and corresponding to the first layout pattern can be effectively prevented from occurring at vicinity of the position corresponding to the boundary, and the process window of the semiconductor process can be improved.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A photomask structure, having a first region and a second region, wherein a layout pattern density of the first region is smaller than a layout pattern density of the second region, and the photomask structure comprises:
- a first layout pattern located in the first region and the second region and across a boundary between the first region and the second region;
- a second layout pattern located in the second region and located on one side of the first layout pattern, wherein the second layout pattern is adjacent to the first layout pattern; and
- at least two adjacent first assist patterns located on a first sidewall of the first layout pattern and separated from each other, wherein the first sidewall is adjacent to the second layout pattern, the at least two adjacent first assist patterns are adjacent to the boundary between the first region and the second region, all the at least two adjacent first assist patterns in the second region are located between the first layout pattern and the second layout pattern, and the lengths of all the at least two adjacent first assist patterns in the second region decrease in the direction away from the boundary.

2. The photomask structure according to claim 1, wherein an extension direction of the at least two adjacent first assist patterns is perpendicular to an extension direction of the first layout pattern.

3. The photomask structure according to claim 1, wherein the at least two adjacent first assist patterns are further located in the first region.

4. The photomask structure according to claim 3, wherein lengths of another at least two adjacent first assist patterns in the first region are the same.

5. The photomask structure according to claim 1, wherein a length of the at least two adjacent first assist patterns closest to the boundary is a greatest length of lengths of the at least two adjacent first assist patterns.

6. The photomask structure according to claim 1, wherein spacings of the at least two adjacent first assist patterns are the same.

7. The photomask structure according to claim 1, wherein spacings of the at least two adjacent first assist patterns are greater than or equal to a minimum spacing specified by a design rule.

8. The photomask structure according to claim 1, wherein a spacing between the at least two adjacent first assist patterns and the second layout pattern is greater than or equal to a minimum spacing specified by a design rule.

9. The photomask structure according to claim 1, further comprising:
- a third layout pattern located in the second region and located on another side of the first layout pattern; and
- at least two adjacent second assist patterns located on a second sidewall of the first layout pattern and separated from each other, wherein the second sidewall is adjacent to the third layout pattern, the at least two adjacent second assist patterns are adjacent to the boundary, and lengths of the at least two adjacent second assist patterns in the second region decrease in the direction away from the boundary.

10. The photomask structure according to claim 9, wherein one end of the first layout pattern extends beyond one end of the third layout pattern.

11. The photomask structure according to claim 9, wherein an extension direction of the at least two adjacent second assist patterns is perpendicular to an extension direction of the first layout pattern.

12. The photomask structure according to claim 9, wherein the at least two adjacent second assist patterns are located in the second region.

13. The photomask structure according to claim 12, wherein the at least two adjacent second assist patterns are further located in the first region.

14. The photomask structure according to claim 13, wherein lengths of another at least two adjacent second assist patterns in the first region are the same.

15. The photomask structure according to claim 9, wherein a length of the at least two adjacent second assist patterns closest to the boundary is a greatest length of lengths of the at least two adjacent second assist patterns.

16. The photomask structure according to claim 9, wherein spacings of the at least two adjacent second assist patterns are the same.

17. The photomask structure according to claim 9, wherein spacings of the at least two adjacent second assist patterns are greater than or equal to a minimum spacing specified by a design rule.

18. The photomask structure according to claim 9, wherein a spacing between the at least two adjacent second assist patterns and the third layout pattern is greater than or equal to a minimum spacing specified by a design rule.

* * * * *